United States Patent
Nir et al.

(10) Patent No.: US 10,693,589 B2
(45) Date of Patent: Jun. 23, 2020

(54) SERDES WITH JITTER INJECTION SELF STRESS MECHANISM

(71) Applicants: Ehud Nir, Ottawa (CA); Henry Wong, Ottawa (CA); Petar Ivanov Krotnev, Ottawa (CA)

(72) Inventors: Ehud Nir, Ottawa (CA); Henry Wong, Ottawa (CA); Petar Ivanov Krotnev, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 25 days.

(21) Appl. No.: 16/011,206

(22) Filed: Jun. 18, 2018

(65) Prior Publication Data
US 2019/0386773 A1    Dec. 19, 2019

(51) Int. Cl.
*H04L 1/00*    (2006.01)
*H04L 12/26*   (2006.01)

(52) U.S. Cl.
CPC .......... *H04L 1/0042* (2013.01); *H04L 1/0045* (2013.01); *H04L 1/0058* (2013.01); *H04L 1/0072* (2013.01); *H04L 43/087* (2013.01)

(58) Field of Classification Search
None
See application file for complete search history.

(56) References Cited

U.S. PATENT DOCUMENTS

| | | | |
|---|---|---|---|
| 7,363,563 B1* | 4/2008 | Hissen | H04L 1/243 327/144 |
| 8,094,705 B2 | 1/2012 | Watkins | |
| 8,228,972 B2 | 7/2012 | Tonietto et al. | |
| 8,453,043 B2* | 5/2013 | Chien | G11C 29/12 714/704 |
| 8,467,436 B1 | 6/2013 | Warner et al. | |
| 2004/0123197 A1 | 6/2004 | Sunter et al. | |
| 2004/0243899 A1* | 12/2004 | Bonneau | G01R 31/31709 714/733 |
| 2004/0268190 A1 | 12/2004 | Kossel et al. | |
| 2005/0069031 A1* | 3/2005 | Sunter | H04L 1/205 375/224 |
| 2005/0111536 A1* | 5/2005 | Cranford, Jr. | H04B 3/462 375/226 |

(Continued)

FOREIGN PATENT DOCUMENTS

| CN | 1985459 A | 6/2007 |
|---|---|---|
| CN | 101057154 A | 10/2007 |
| CN | 104954044 A | 9/2015 |

OTHER PUBLICATIONS

D. Tonietto et al., "A 7.5Gb/s Transmitter with Self-Adaptive FIR", 2008 Symposium on VLSI Circuits Digest of Technical Papers.

*Primary Examiner* — Michael J Moore, Jr.

(57) ABSTRACT

Devices and methods are provided for performing a high-frequency jitter self stress check on a receiver to assist with optimization. High-frequency jitter is injected into a clock signal recovered from a received data signal and used to sample the data signal. The injected jitter increases the bit error rate (BER), making BER a more useful and quicker optimization metric in applications using low-noise communication links. Error correction is used to maintain acceptable output BER while the self stress check is in progress.

22 Claims, 5 Drawing Sheets

(56) References Cited

U.S. PATENT DOCUMENTS

| | | | |
|---|---|---|---|
| 2005/0193290 A1* | 9/2005 | Cho | G01R 31/31709 714/710 |
| 2005/0253617 A1 | 11/2005 | Roberts et al. | |
| 2005/0271131 A1 | 12/2005 | Hafed et al. | |
| 2008/0013609 A1* | 1/2008 | Daxer | H04B 3/46 375/221 |
| 2008/0240212 A1* | 10/2008 | Satou | H04L 1/24 375/221 |
| 2009/0119554 A1* | 5/2009 | Dai | H04L 25/0264 714/717 |
| 2009/0224809 A1* | 9/2009 | Matsumoto | H03L 7/08 327/141 |
| 2009/0304054 A1* | 12/2009 | Tonietto | H04L 1/205 375/221 |
| 2010/0026314 A1 | 2/2010 | Schuttert | |
| 2010/0232489 A1* | 9/2010 | Watkins | G01R 31/31709 375/226 |
| 2013/0091392 A1* | 4/2013 | Valliappan | H04L 7/0331 714/700 |
| 2015/0215111 A1* | 7/2015 | Ruby | H03L 7/099 375/376 |
| 2018/0248661 A1* | 8/2018 | Chandrasekaran | H04L 7/0079 |

* cited by examiner

SERDES WITH JITTER INJECTION SELF STRESS MECHANISM

FIELD

The present disclosure relates to serializer-deserializers (SerDes). In particular, the present disclosure relates to methods and systems for optimization of system parameters in SerDes.

BACKGROUND

A serializer-deserializer (SerDes, or SERDES) is a pair of functional blocks used for high-speed communication between two systems, such as two application-specific integrated circuits (ASICs), across a limited input/output link between the two systems. Generally, each system will include at least one SerDes transmitter and at least one SerDes receiver, thereby allowing bidirectional communication, although some such SerDes will use only transmitters on the first system and only receivers on the second system.

A SerDes communicates across the input/output link using a high-speed digital signal. This signal is transmitted by the SerDes transmitter, and the characteristics of the signal are determined by various system parameters set by the SerDes Transmitter and/or receiver. These system parameters may include sampling timing offset; sampling vertical (voltage) offset; amount of gain provided by a continuous time linear equalizer (CTLE); amount of gain provided by a decision feedback equalizer (DFE); power consumption; and potentially others. The settings used for these system parameters by the transmitter and/or receiver affect the various characteristics of the signal received at the other end of the link at the receiver: amplitude, phase, noise, and so forth.

As SerDes data rates have increased with advances in communication technology, signal integrity has become more difficult to maintain across the input/output link. A variety of impairments (ISI, Integrated Crosstalk Noise, random noise, etc.) can affect the transmission of data over a link, and result in signal-to-noise ratio (SNR) being compromised and errors appearing at the receiver.

Accordingly, newer standards for SerDes recommend the use of Forward Error Correction (FEC) at data rates of 25 Gbps (gigabit per second); at data rates above 25 Gbps, or where PAM4 modulation is used, FEC becomes mandatory. Forward Error Correction is a system for detecting and correcting errors in the coded data stream received by the receiver of a SerDes.

In a typical FEC configuration, a redundancy overhead is added to the payload data at the transmitter side, using a certain coding. The coding allows for errors to be detected and corrected, up to a certain threshold (which depends on the amount and type of coding overhead and type of error pattern).

The rate of received errors is referred to as the Bit Error Rate (BER). The FEC module is capable of correcting a certain number of errors per unit of time, and its efficacy is measured by its Coding Gain. The Coding Gain of the FEC module is calculated as the ratio between the SNR required for achieving the BER at the output of the FEC module, without using the FEC, and the SNR at the input to the FEC module.

A FEC module with a higher Coding Gain means that the received coded signal can have a lower SNR without disrupting output signal integrity. With high Coding Gain, a significant rate of bit error can appear at the input of the FEC module before errors appear at the FEC module output.

For example, conventional FEC modules used in wire line communications, the KR4 FEC and KP4 FEC, have respectively 5.8 dB and 7.2 dB of Coding Gain when the FEC input BER levels are below 1E-5. This means the BER at the output of these FEC modules can be below 10E-17 with BERs on the order of 1E-4 and 1E-5, respectively, at their inputs.

Another concern with SerDes design is that, as signal integrity is reduced and link margins shrink, the fine tuning of system parameters becomes more important in order to optimize link quality and other system characteristics, yet at the same time the sensitivity and narrow link margins of the system makes such tuning more difficult when the link is in use because of the risk of disrupting the integrity of the signal.

Accordingly, SerDes systems presently use two methods for optimization of system parameters: SerDes Calibration, which calibrates the system parameters based on characteristics of the SerDes blocks themselves, and SerDes Adaptation, which monitors the performance of the input/output link and adapts the system to characteristics of the link as well as characteristics of the SerDes blocks. These methods are used in a typical SerDes to optimize the BER at the receiving end.

SerDes Calibration is typically carried out when a link starts up. It is not dependent on the link. It adjusts a variety of system parameters in the circuitry as follows: a quantity (e.g. voltage, current, or phase) is measured via a measuring circuit, such as an analog-to-digital converter (ADC), and action is taken to increase or decrease that quantity until the quantity reaches a target level. The quantities being measured may be, for example, voltage offsets, timing offsets, and/or current. All of these system parameters are calibrated independently from the BER at the receiver. Calibrations are carried out with closed loop state machines that aim to reach a design target for a certain voltage or current. The assumption built into the design of the SerDes is that if all the system parameters are calibrated to the target point, the BER will be minimized.

SerDes Adaptation is typically carried out at link startup time, as well as continuously in the background during link operation while data is being transmitted. SerDes Adaptation depends upon the link itself. It typically involves the optimization of continuous time and discrete time filters that are used to minimize inter-symbol interference (ISI) due to channel insertion loss. In more sophisticated systems, SerDes Adaptation may include other system parameters, such as sampling voltage and timing offset, which may different for different channels. SerDes Adaptation typically includes: transmitter Finite Impulse Response (FIR), which is typically carried out only at start up via standard link training protocols; receiver continuous time linear equalization (CTLE), which is typically carried out using eye monitoring metrics; and decision feedback equalization (DFE), which is typically carried out using a least mean square (LMS) algorithm. As temperature, voltage and other environmental conditions vary in time, SerDes Adaptation keeps optimizing the transceiver system parameters in an attempt to maintain signal integrity.

While maintaining signal integrity is the primary goal of optimizing system parameters, it is also desirable to minimize the use of power without losing signal integrity. Power consumption is therefore one of the system parameters that should be minimized when optimizing for signal integrity.

When performing power optimization, it is necessary to determine the link margin. The power committed to equalization can be reduced as long as a sufficient link margin is maintained.

One way to monitor link margin is to monitor BER of the received signal. However, this technique has two major drawbacks. First, in a low loss communication channel, a very low BER level requires measuring BER over a long period of time to calculate an accurate average BER. Second, when measured for short periods of time, the BER metric may experience fluctuations resulting from its statistical nature, making it difficult to discriminate between two configurations which produce similar BER.

SUMMARY

The present disclosure describes example circuits and methods that provide a self-stress check for a SerDes receiver.

In accordance with a first aspect of the present invention, there is provided a receiver comprising a clock and data recovery circuit, a sampling circuit and an error correction circuit. The clock and data recovery circuit is configured to recover a clock signal from a data signal received over a communication channel. The sampling circuit is configured to sample the data signal, in accordance with a stressed clock signal generated in accordance with the recovered clock signal and injected jitter, and to generate a stressed output signal. The error correction (EC) circuit is configured to check the BER of the stressed output signal.

In an embodiment of the first aspect, the receiver further comprises a jitter generator for injecting the injected jitter into the recovered clock signal to generate the stressed clock signal.

In another embodiment, the receiver further comprises a controller for receiving BER information from the EC circuit and generating one or more control signals based on the BER information. In some embodiments, the controller is configured to perform one or more optimization processes selected from the following list: SerDes Calibration and SerDes Adaptation. In some embodiments, the receiver further comprises an analog front-end for receiving at least one of the one or more control signals and altering the value of one or more system parameters in response to the received at least one control signal. In optional embodiments, the system parameters include one or more system parameters selected from the following list: receiver termination value, voltage supply, voltage offset, bias current, continuous time linear equalizer (CTLE) frequency boost, CTLE bandwidth, CTLE gain, sampling latch voltage offset, sampling time offset, sampling time mismatch between sampled channels, analog-to-digital converter accuracy, decision feedback equalizer tap values, and finite impulse response tap values.

In an embodiment, the receiver further comprises a digital signal processing circuit for receiving at least one of the one or more control signals and altering the value of one or more system parameters in response to the received at least one control signal. Optionally, the system parameters include one or more system parameters selected from the following list: decision feedback equalizer tap values, finite impulse response tap values, and slicer threshold.

In another embodiment, the error correction circuit is configured to correct errors in the data signal; and the jitter generator is configured to inject jitter into the recovered clock signal during mission-mode adaptation of the communication channel. In further embodiments, the jitter generator is configured to inject jitter into the recovered clock signal during calibration of the communication channel at startup. In an embodiment, the receiver further comprises a second sampler for sampling the data signal using the recovered clock signal to generate a clean output signal.

In accordance with a second aspect of the present invention, there is provided a method for optimizing a receiver. The method comprises recovering a clock signal from a data signal received over a communication channel; sampling the data signal, in accordance with a stressed clock signal generated in accordance with the recovered clock signal and injected jitter, to generate a stressed output signal; and detecting the bit error rate (BER) of the stressed output signal; and making an optimization decision based on the detected BER.

In an embodiment of the second aspect, the method further comprises injecting the injected jitter into the recovered clock signal to generate the stressed clock signal. In another embodiment, making an optimization decision comprises: changing a configuration of the receiver if the detected BER of the stressed output signal is above a predetermined threshold. In another embodiment, the method further comprises, after the detection of the BER of the stressed output signal: changing a configuration of the receiver from a first configuration to a second configuration; and repeating the steps of recovering clock phase information, injecting jitter, sampling the data signal, and detecting the BER of the stressed output signal, wherein making an optimization decision comprises using one of the first configuration and the second configuration in accordance with a comparison of a metric of the first configuration and a metric of the second configuration. In some embodiments, the metric comprises the BER. In some embodiments, the metric comprises the ratio of the BER to the amplitude of the jitter injected. In some embodiments the amplitude of the jitter injected in the first configuration is equal to the amplitude of the jitter injected in the second configuration. In some embodiment, the amplitude of the jitter injected in the first configuration is different from the amplitude of the jitter injected in the second configuration.

In another embodiment, the method further comprises, after detecting the BER of the stressed output signal: repeating the steps of recovering the clock signal, injecting jitter, sampling the data signal, and detecting BER until the BER reaches an unacceptable level, wherein an amplitude of the injected jitter is increased; changing a configuration of the receiver from a first configuration to a second configuration; setting the injected jitter to a baseline level; and increasing the amplitude of the injected jitter while repeating the steps of recovering clock phase information, injecting jitter, sampling the data signal, and detecting BER until the BER reaches an unacceptable level; wherein making an optimization decision comprises using one of the first configuration and the second configuration in accordance with a comparison of a metric of the first configuration and a metric of the second configuration. In some embodiments the metric comprises the amplitude of the jitter injected causing the BER to reach the unacceptable level, the higher amplitude being the superior metric. In some embodiments, the metric comprises the ratio of the BER to the amplitude of the jitter injected, the lower ratio being the superior metric.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

The present disclosure describes example devices and methods that enable the use of jitter injection to perform a stress self-check in a SerDes receiver.

As discussed in the Background section above, self-stress checks may be used in SerdDes, especially those operating over low loss channels, to increase the speed and accuracy or power and system optimization based on BER. While prior approaches have relied on jitter injection on the transmitter side, the presently described examples instead use a jitter injection self stress check technique on the receiver side of a SerDes. This approach has the potential to avoid the drawbacks of the prior technique discussed in the Background section.

By injecting jitter into the received data signal, the SerDes receiver provides an enhancement mechanism for the speedup of metric harvesting. In described examples, the stressing is in the form of modulated jitter, injected into the clock that samples the incoming signal. The injection is done via the clock and data circuitry which rotates a phase interpolator in the clock path.

In described examples, the jitter frequency is relatively high, crossing into the CDR (clock and data recovery) circuit non-tracking region. (All subsequent references to "jitter" herein will be understood by the skilled person to refer to high-frequency jitter in the CDR non-trackable region.) This perturbation increases the determined bit error rate in the digital front end, potentially enabling a significant speedup of several orders of magnitude in BER metric calculation. This has the potential to solve the first problem with BER metric optimization identified in the Background section above, namely that harvesting BER in low loss channels must take place over a long period of time.

The second identified problem with using BER as a metric for optimization—the difficulty of distinguishing between two configurations with similar BER—can also potentially be addressed by this technique. By injecting an increasing amount of stress (in the form of jitter) into two different configurations, the configuration which can endure more stress can be selected as superior. The jitter regimes applied to each configuration, and how they are applied, may vary in different examples of the technique, as further described below.

Alternatively, rather than using BER itself (magnified by the injected jitter) as the metric, the system may instead use as its metric (BER/(jitter stress magnitude)), or the ratio of BER to the magnitude of jitter stress applied. In addition to addressing the second problem, this alternative metric may also have the advantage of avoiding local BER minima.

The described examples potentially exhibit a number of benefits. First, link training and other time-constrained protocols can benefit from speeding up the BER-based optimization, without which BER would potentially have to be replaced with a less accurate or less directly useful metric.

Second, compared with other optimization methods, described examples do not involve a second channel back from the receiver to the transmitter or any other back channel.

Third, because no second channel is required, described examples can also be applied for mission-mode background adaptation where error correction (EC), such as forward error correction, is being used. In this case, the amount of jitter stress injected by the system is limited by the BER rate which is fixable by the EC (i.e. the EC gain).

Figure 1:
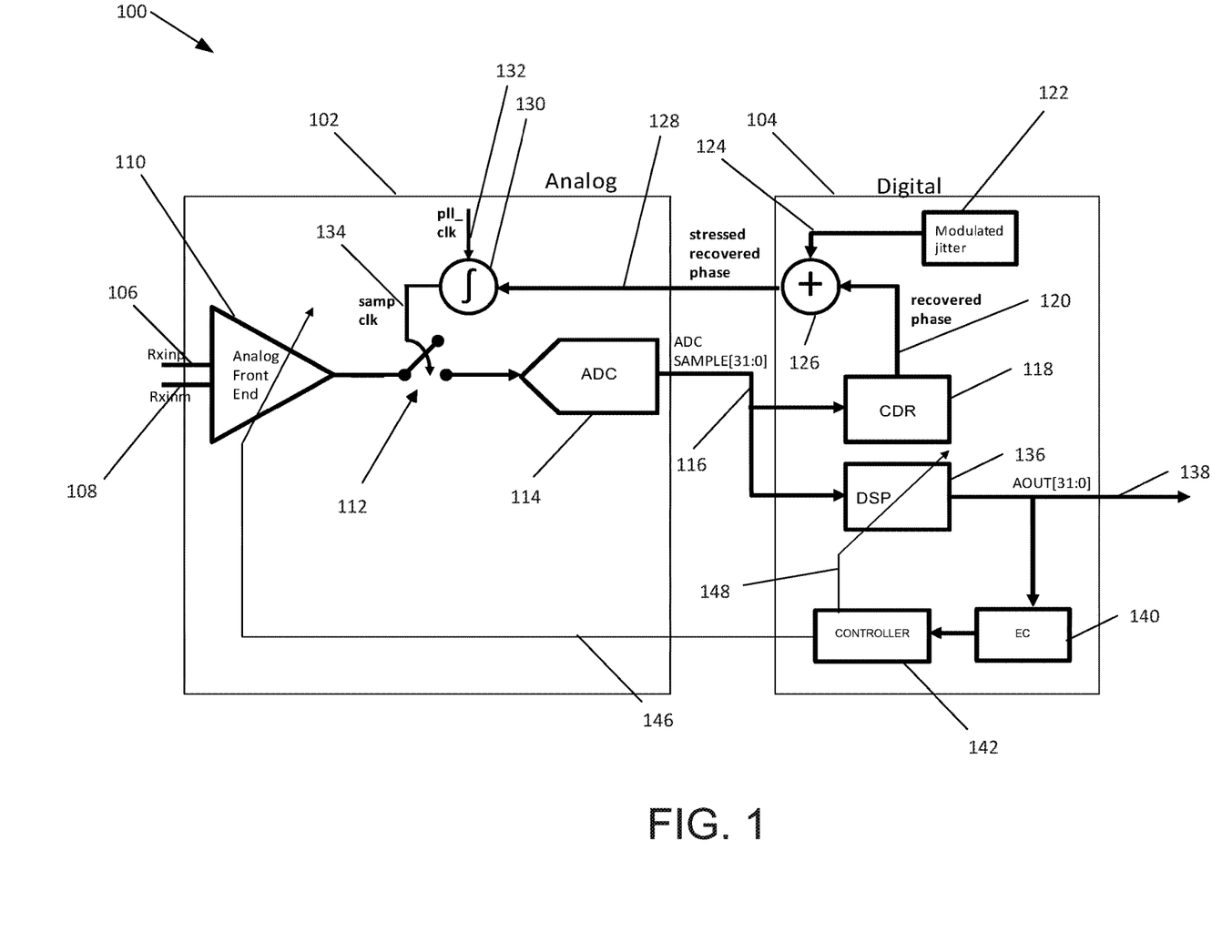
FIG. 1 is a block diagram showing an example SerDes receiver with a jitter-injection self-stress check system.

Example embodiments are now described with reference to the figures. FIG. 1 is a block diagram of an example SerDes receiver 100 with a jitter self-stress check system. The receiver 100 is roughly divided into an analog block 102 and a digital block 104, although in different examples some of the components may be shifted from one block to the other.

A differential data signal is received over a communication channel, consisting of a positive polarity input signal 106 and a negative polarity input signal 108. These input signals 106,108 are received by an analog front end 110, which in turn produces an analog output signal sampled at sampler 112 and converted to a digital data signal 116 by an analog-to-digital converter (ADC) 114, thereby moving from the analog block 102 to the digital block 104.

A clock and data recovery circuit (CDR) 118 recovers the phase of the clock from the digital data signal 116. This recovered phase information 120 is added by a summer 126 to modulated jitter 124 generated by a modulated jitter generator 122, thereby generating a stressed recovered phase signal 128. In the illustrated example, the summer 126 generates a digital output signal from analog inputs and is situated within the digital block 104, but in other examples it could be migrated to the analog block 102 if the recovered phase information 120 and modulated jitter 124 were provided as digital signals.

A phase interpolator 130 receives a phase-locked loop (PLL) clock signal 132 and the stressed recovered phase signal 128 and generates a sample clock 134. This sample clock 134 is used to sample the analog output signal at the sampler 112, thereby providing a feedback path from the digital block 104 to the analog block 102 and completing a phase-locked loop with injected modulated jitter.

The digital data signal 116 is also received by a digital signal processing (DSP) circuit 136, which produces the output signal 138 of the receiver 100. A bit error rate (BER) checker, such as an error correction (EC) circuit 140, checks the output signal 138 for BER and sends BER metric information to a controller 142. Based on the detected BER, the controller 142 sends DSP control signals 148 to the DSP circuit 136 and analog front-end control signals 146 to the analog front-end 110. These control signals 148,146 may in some examples include settings for various optimization parameters, allowing the receiver 100 to calibrate and/or adapt to optimize these parameters based on the detected BER in the presence of injected modulated jitter 124. In some examples, the controller 142 may be further configured to provide jitter generator control signals to the modulated jitter generator 122.

In operation, the stressed sample clock 134 increases the effective BER measured at the output of the DSP circuit 136. The increased BER enables rapid BER measurement at the error correction (EC) circuit 140. The controller 142 can then react to the BER measurements and adapt the receiver components in a timely manner.

In some examples, the stressing by the modulated jitter generator 122 is applied only during adaptation time and turned off otherwise. The operation of the modulated jitter generator 122 to produce the modulated jitter 124 is described in greater detail below with reference to example methods of operation of the self-stress check system.

The described BER based metric with injected jitter may in some examples be practical for low loss channels that otherwise exhibit BER to low to practically use for optimization. The complexity level of the example implementation illustrated at FIG. 1 is fairly low. There is also potentially no impact on the power consumption of the analog front-end 110 if the CDR feedback path is through a phase interpolator 130, as shown in the illustrated example.

In some examples, the jitter injection stress test can be applied by the modulated jitter generator 122 during background adaptation, and it may contribute to power reduction by reducing the adaptation duty cycle. As noted above, a SerDes using FEC may have a FEC input BER level low enough that the excess BER resulting from the jitter injected during mission mode will still be below the maximum BER level which the FEC can correct. This can assist with background adaptation without disrupting signal quality.

In some examples, the modulated jitter generator 122 only applies the modulated jitter 124 during link training at startup. In other examples, the jitter may be injected both at startup adaptation and during ongoing background adaptation.

Figure 2:
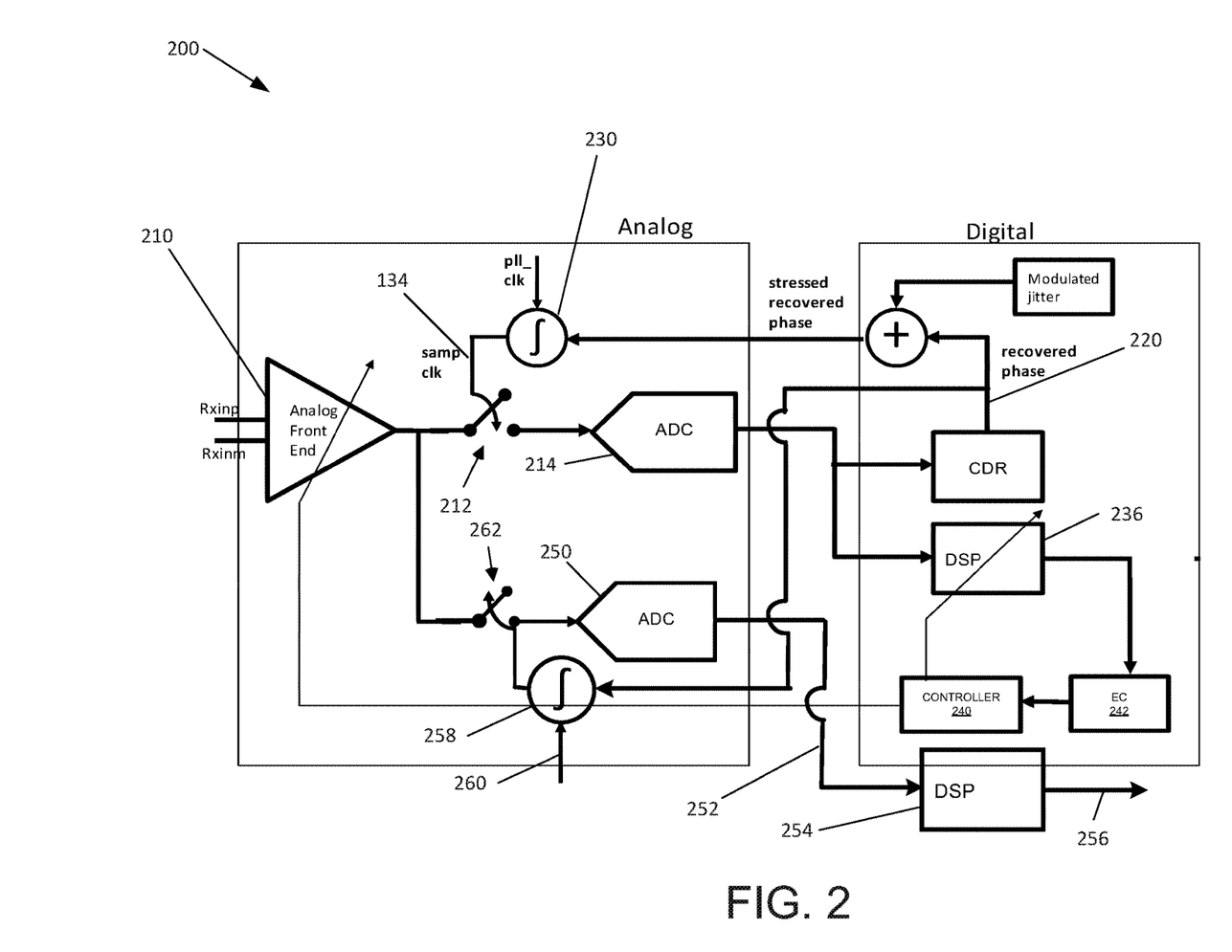
FIG. 2 is a block diagram showing an alternative example SerDes receiver with a jitter-injection self-stress check system and a parallel stress-less data recovery path.

An alternative example SerDes using two ADC units in two parallel paths is shown in FIG. 2. This example receiver 200 has a CDR feedback path that mirrors its counterpart receiver 100 from FIG. 1, including a first ADC 214 that receives the samples taken by the first sampler 212. However, it also has a parallel path from the analog front-end 210 to a second sampler 262 and a second ADC 250. This second sampler 262 samples the analog signal using an un-stressed clock signal generated by a second phase interpolator 258 using a second PLL clock signal 260 and, in contrast to the first phase interpolator 230 in the CDR feedback loop, using the un-stressed (clean) recovered phase information 220. The digital data signal 252 generated by the second ADC 250 is used by a second DSP 254 to generate the receiver output signal 256. The first DSP 236, as in receiver 100 from FIG. 1, is used by the error correction (EC) circuit 242 and controller 240 to optimize the system.

This alternative receiver 200 may allow more margin for injecting large amounts of jitter during mission mode without losing signal quality. In some applications, this may be worth the added power, space, and complexity of a second ADC, second DSP circuit, and other components.

The described examples make reference to a SerDes receiver. However, the described technique for jitter-injection self-stress checking is applicable to any receiver receiving a signal over any communication link, such as an electrical, optical, or wireless link.

BER is generally measured using an error correction (EC) circuit such as EC circuit 140 or EC circuit 240. In some examples, these may comprise EC modules built into an integrated circuit along with the other circuit components. In other examples, at least some of the error correction logic may be implemented using software or firmware. While FEC is the standard form of error correction used in many high-speed SerDes application, ARQ or backwards error correction may be used in some examples. Any component able to measure BER can be used to generate the BER data used for the metrics used by the described examples.

Example methods are now described for optimizing a receiver, such as a SerDes receiver, using a jitter-injection self-stress check, with reference to the figures.

Figure 3:
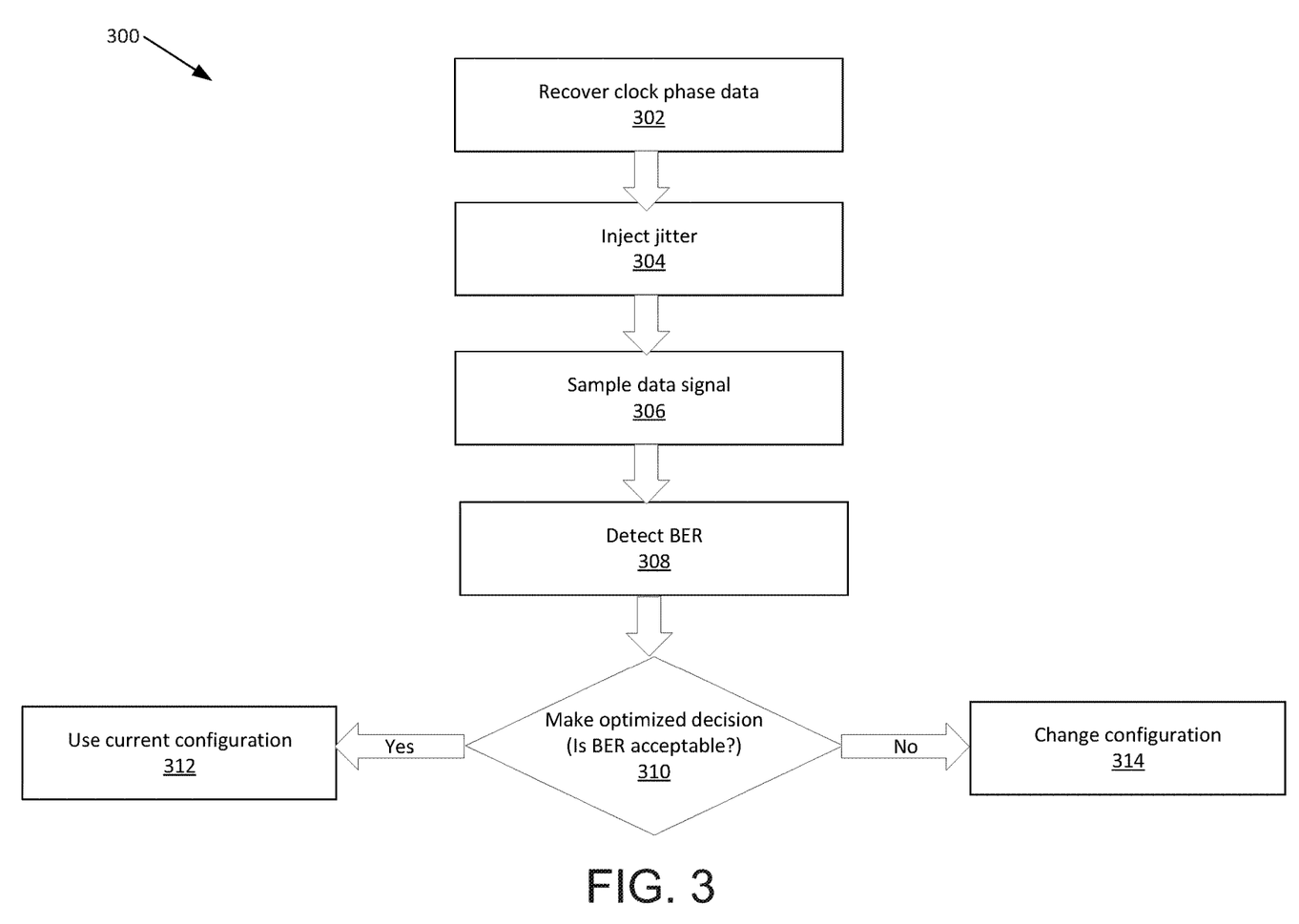
FIG. 3 is a flowchart showing a first example method for optimizing a receiver using a jitter-injection self-stress check using an acceptable BER threshold to trigger changes in the receiver configuration.

FIG. 3 shows a flowchart of a first example method 300 for optimizing a receiver (such as SerDes receiver 100) using a jitter-injection self-stress check. At step 302, clock phase information (such as phase information 120) is recovered from a data signal (such as differential data signal 106,108) received over a communication channel. At step 304, jitter is injected into the recovered clock phase information (such as by jitter generator 122 and summer 126). At step 306, the data signal (e.g. 106,108) is sampled using the clock phase information with injected jitter (such as stressed recovered phase signal 128) to generate a stressed output signal (such as digital data signal 116). At step 308, the bit error rate (BER) of the stressed output signal is detected (such as by EC circuit 140). Finally, at step 310, an optimized decision is made (such as setting one or more optimization parameters using control signals 146,148) based on the detected BER. Specifically, the optimized decision made at step 310 comprises maintaining a current configuration of the receiver if the BER of the stressed output signal is acceptable (step 312), or changing the current configuration of the receiver (e.g. changing one or more parameter settings) if the BER of the stressed output signal is not acceptable (step 314). In the illustrated example, the method repeats continuously as data is received over the communication link.

An example implementation of the method 300 of FIG. 3 uses an acceptable BER threshold to trigger re-configuration of the parameters, such as power consumption. If an unacceptable BER level is detected at step 308, the receiver increases power applied to equalization and/or changes one or more other parameters to achieve lower BER at step 314.

Figure 4:
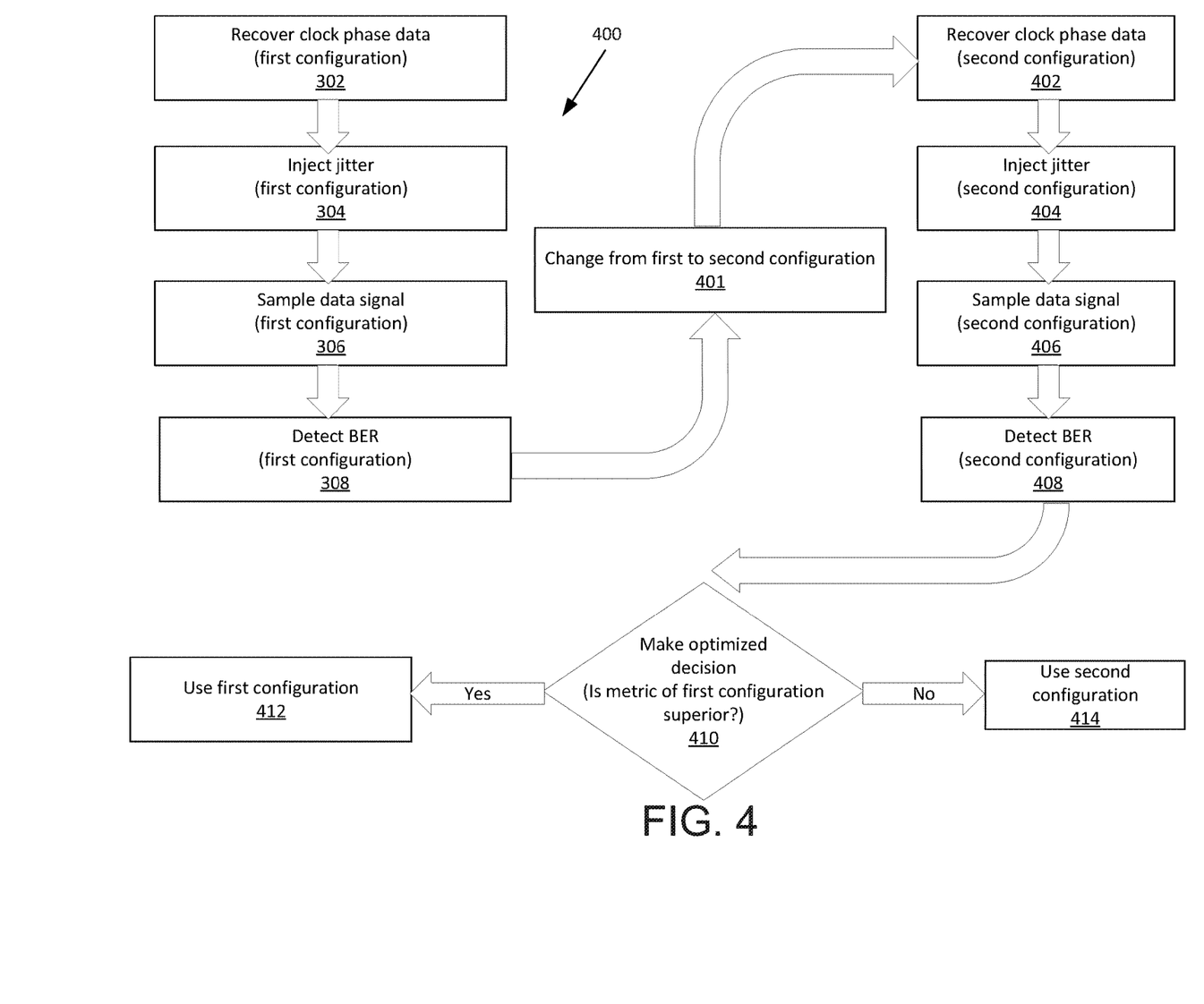
FIG. 4 is a flowchart showing a second example method for optimizing a receiver using a jitter-injection self-stress check using a BER comparison between two configurations.

A second example method 400 is shown in the flowchart of FIG. 4. The same steps 302 to 308 as method 300 are carried out using a first configuration of the receiver. Then, at step 401, the receiver configuration (e.g. one or more parameter settings) is changed to a second configuration, and steps 402 to 408 are carried out in the second configuration, these steps corresponding to steps 302 through 308. Once BER has been detected for both the first and second configurations has been made, an optimized decision is made at step 410. This decision comprises a choice between: using the first configuration at step 412 if a BER metric of the first configuration is superior to the BER metric of the second configuration; and otherwise using the second configuration at step 414.

In methods 300 and 400, the amount of jitter injected at step 304 and step 404 may be a fixed amount.

In method 400, the amount of jitter injected may be either the same or different for the first configuration as opposed to the second configuration. The BER metric used may in some examples be the BER itself, or it may be a metric that uses BER as one of its inputs. For example, the BER metric may be a ratio of the BER (as measured at step 308 or 408) to the amplitude of jitter injected at step 304 or 404. Using this ratio as the BER metric may allow different amounts or amplitudes of jitter to be injected in the two configurations while nonetheless producing a useful BER metric.

Figure 5:
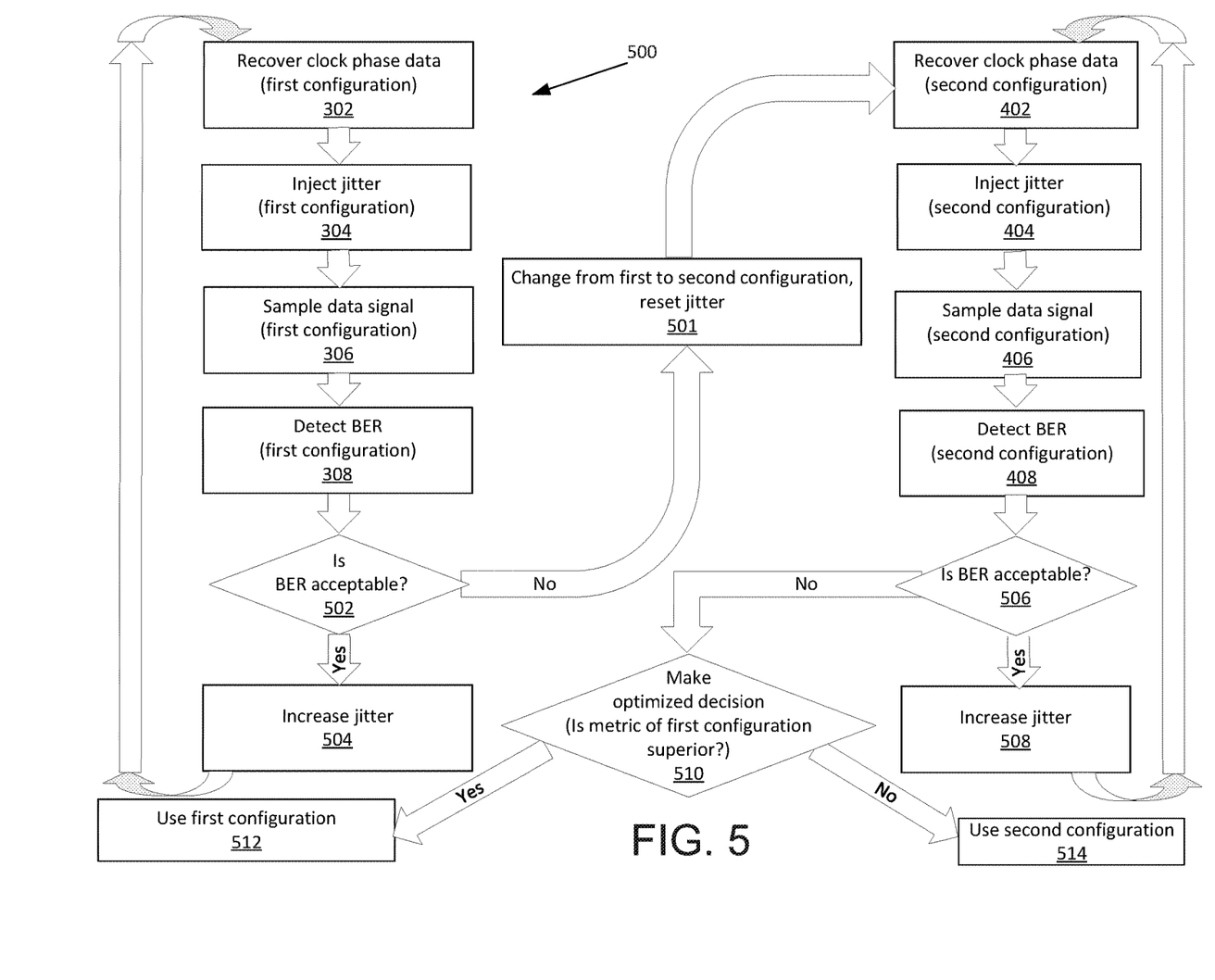
FIG. 5 is a flowchart showing a third example method for optimizing a receiver using a jitter-injection self-stress check using a comparison of the ratio of BER to injected jitter as between two configurations with variable amounts of jitter injected.

A third example method 500 is shown in the flowchart of FIG. 5. Here, steps 302 to 308 are performed on a first configuration as in methods 300 and 400. At step 502, if the BER is deemed acceptable (e.g., BER is below an acceptable threshold), the amplitude or amount of injected jitter is increased at step 504, and steps 302 to 308 and 502 to 504 are repeated as long as the BER is still deemed acceptable at step 502.

Once BER is deemed unacceptable at step 502, the receiver is changed to a second configuration and the injected jitter is returned to a baseline amplitude level at step 501. Steps 402 through 408 are then carried out (corresponding to steps 302 to 308). Steps 506 and 508 (corresponding to steps 502 and 504) are also carried out. Steps 402 to 408 and 506 to 508 repeat as long as the BER of the second configuration is deemed acceptable.

Once the second configuration has reached unacceptable BER at step 506, an optimized decision is then made at step 510. Either the first configuration is used (step 512) or the second configuration is used (step 514) depending on a BER metric of the first configuration compared to the BER metric of the second configuration.

In some examples, the BER metric used in method 500 is the ratio of BER to injected jitter in the last cycle for each configuration. Thus, if the first configuration can withstand a larger amplitude of injected jitter before reaching an unacceptable BER threshold than the second configuration can, the ratio of the first configuration of (BER when the unacceptable BER threshold is reached) to (amplitude of jitter injected in final cycle during which the unacceptable BER threshold is reached) will be lower than the same ratio for the second configuration. In other examples, a different BER metric may be used, such as the amplitude of jitter injected in the final cycle causing the BER to become unacceptably high.

While the steps involving the first and second configurations in methods 400 and 500 are described as being in a specific order, it will be appreciate that some of these steps could be performed in a different order in some examples. For example, the amount of jitter applied to the first and second configuration may be increased in alternation between the two configurations rather than in a series of cycles for the first configuration, followed by a series of cycles for the second configuration.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., an embedded processor, a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A receiver comprising:
   a clock and data recovery circuit for recovering a clock signal from a data signal received over a communication channel;
   a sampling circuit for sampling the data signal, in accordance with a stressed clock signal generated in accordance with the recovered clock signal and injected jitter, to generate a stressed output signal; and
   an error correction (EC) circuit configured to check the bit error rate (BER) of the stressed output signal.

2. The receiver of claim 1, further comprising a jitter generator for injecting the injected jitter into the recovered clock signal to generate the stressed clock signal.

3. The receiver of claim 1, further comprising a controller for receiving BER information from the EC circuit and generating one or more control signals based on the BER information.

4. The receiver of claim 3, wherein the controller is configured to perform one or more optimization processes selected from the following list: Serializer-Deserializer (SerDes) Calibration and SerDes Adaptation.

5. The receiver of claim 3, further comprising an analog front-end for receiving at least one of the one or more control signals and altering a value of one or more system parameters in response to the received at least one control signal.

6. The receiver of claim 5, wherein the system parameters include one or more system parameters selected from the following list: receiver termination value, voltage supply, voltage offset, bias current, continuous time linear equalizer (CTLE) frequency boost, CTLE bandwidth, CTLE gain, sampling latch voltage offset, sampling time offset, sampling time mismatch between sampled channels, analog-to-digital converter accuracy, decision feedback equalizer tap values, and finite impulse response tap values.

7. The receiver of claim 3, further comprising a digital signal processing circuit for receiving at least one of the one or more control signals and altering the value of one or more system parameters in response to the received at least one control signal.

8. The receiver of claim 7, wherein the system parameters include one or more system parameters selected from the following list: decision feedback equalizer tap values, finite impulse response tap values, and slicer threshold.

9. The receiver of claim 2, wherein:
   the error correction circuit is configured to correct errors in the data signal; and the jitter generator is configured to inject jitter into the recovered clock signal during mission-mode adaptation of the communication channel.

10. The receiver of claim 2, wherein the jitter generator is configured to inject jitter into the recovered clock signal during calibration of the communication channel at startup.

11. The receiver of claim 1, further comprising a second sampler for sampling the data signal using the recovered clock signal to generate a clean output signal.

12. A method for optimizing a receiver, comprising:
recovering a clock signal from a data signal received over a communication channel;
sampling the data signal, in accordance with a stressed clock signal generated in accordance with the recovered clock signal and injected jitter, to generate a stressed output signal;
detecting a bit error rate (BER) of the stressed output signal; and
making an optimization decision based on the detected BER.

13. The method of claim 12, further comprising:
injecting the injected jitter into the recovered clock signal to generate the stressed clock signal.

14. The method of claim 12, wherein making an optimization decision comprises:
changing a configuration of the receiver if the detected BER of the stressed output signal is above a predetermined threshold.

15. The method of claim 12, further comprising, after detecting the BER of the stressed output signal:
changing a configuration of the receiver from a first configuration to a second configuration; and
repeating the steps of recovering clock phase information, injecting jitter, sampling the data signal, and detecting the BER of the stressed output signal,
wherein making an optimization decision comprises:
using one of the first configuration and the second configuration in accordance with a comparison of a metric applied to the first configuration and the metric applied to the second configuration.

16. The method of claim 15, wherein the metric comprises the BER.

17. The method of claim 15, wherein the metric comprises a ratio of the BER to the amplitude of the jitter injected.

18. The method of claim 15, wherein the amplitude of the jitter injected in the first configuration is equal to the amplitude of the jitter injected in the second configuration.

19. The method of claim 15, wherein the amplitude of the jitter injected in the first configuration is different from the amplitude of the jitter injected in the second configuration.

20. The method of claim 12, further comprising, after detecting the BER of the stressed output signal:
repeating the steps of recovering the clock signal, injecting jitter, sampling the data signal, and detecting BER until the BER reaches an unacceptable level, wherein an amplitude of the injected jitter is increased;
changing a configuration of the receiver from a first configuration to a second configuration;
setting the injected jitter to a baseline level; and
increasing the amplitude of the injected jitter while repeating the steps of recovering clock phase information, injecting jitter, sampling the data signal, and detecting BER until the BER reaches an unacceptable level;
wherein making an optimization decision comprises:
using one of the first configuration and the second configuration in accordance with a comparison of a metric applied to the first configuration and the metric applied to the second configuration.

21. The method of claim 20, wherein the metric comprises an amplitude of the jitter injected causing the BER to reach the unacceptable level, the higher amplitude being the superior metric.

22. The method of claim 20, wherein the metric comprises a ratio of the BER to the amplitude of the jitter injected, and wherein using one of the first configuration and the second configuration comprises using the configuration having the lower ratio.

* * * * *